(12) United States Patent
Lim et al.

(10) Patent No.: US 9,269,443 B2
(45) Date of Patent: Feb. 23, 2016

(54) SEMICONDUCTOR DEVICE AND PROGRAM FAIL CELLS

(71) Applicant: SK hynix Inc., Icheon-si Gyeonggi-do (KR)

(72) Inventors: In Geun Lim, Seoul (KR); Min Kyu Lee, Icheon-si (KR); Chi Wook An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 43 days.

(21) Appl. No.: 14/263,121

(22) Filed: Apr. 28, 2014

(65) Prior Publication Data

US 2015/0146488 A1 May 28, 2015

(30) Foreign Application Priority Data

Nov. 22, 2013 (KR) .................. 10-2013-0143163

(51) Int. Cl.
  *G11C 11/34* (2006.01)
  *G11C 16/10* (2006.01)
  *G11C 16/04* (2006.01)
  *G11C 16/26* (2006.01)
  *G11C 16/34* (2006.01)

(52) U.S. Cl.
  CPC ............ *G11C 16/10* (2013.01); *G11C 16/0483* (2013.01); *G11C 16/26* (2013.01); *G11C 16/3454* (2013.01)

(58) Field of Classification Search
  USPC ............ 365/185.09, 185.11, 185.12, 185.17, 365/185.18, 185.21, 185.22, 185.29, 185.33
  See application file for complete search history.

(56) References Cited

U.S. PATENT DOCUMENTS

| | | | | |
|---|---|---|---|---|
| 8,446,776 B2* | 5/2013 | Hwang et al. | ............ | 365/185.22 |
| 8,634,246 B2* | 1/2014 | Kang et al. | ................ | 365/185.22 |
| 8,767,481 B2* | 7/2014 | Cho et al. | ................. | 365/185.09 |
| 8,773,911 B2* | 7/2014 | Park | .......................... | 365/185.22 |
| 8,897,069 B2* | 11/2014 | Choi | ......................... | 365/185.22 |
| 8,923,056 B2* | 12/2014 | Kim | .......................... | 365/185.22 |
| 9,013,924 B2* | 4/2015 | Yang | ......................... | 365/185.22 |

FOREIGN PATENT DOCUMENTS

KR  1020090019194 A  2/2009
KR  1020120140508 A  12/2012

* cited by examiner

*Primary Examiner* — Trong Phan

(74) *Attorney, Agent, or Firm* — William Park & Associates Ltd.

(57) ABSTRACT

A semiconductor device includes a memory block including even memory cells configured to form an even page and odd memory cells configured to form an odd page. The semiconductor device may also include an operation circuit configured to perform a program operation on the even memory cells and the odd memory cells. A first verify operation may separately verify the even memory cells and the odd memory cells, and a second verify operation may simultaneously verify the even memory cells and the odd memory cells. Further, the operation circuit may be configured to selectively perform the first verify operation and the second verify operation depending on a number of adjacent program fail cells in response to a verify result value.

20 Claims, 8 Drawing Sheets

SEMICONDUCTOR DEVICE AND PROGRAM FAIL CELLS

CROSS-REFERENCE TO RELATED APPLICATION

The present application claims priority to Korean patent application number 10-2013-0143163 filed on Nov. 22, 2013, in the Korean Intellectual Property Office, the entire disclosure of which is incorporated by reference herein.

BACKGROUND

1. Technical Field

Various embodiments relate generally to a semiconductor device and a method of operating the same and, more particularly, to a semiconductor device capable of storing data.

2. Related Art

After data is stored in memory cells in a program operation, a verify operation may be performed in order to confirm whether the data is normally stored. Threshold voltages of flash memory cells may be increased during a program operation. In addition, may be determined whether the threshold voltages of the flash memory cells have been increased to a target level during a verify operation.

After the verify operation, the memory cells may be divided into program pass cells in which the data is normally stored and program fail cells in which the data is abnormally stored. A program pass cell may refer to a memory cell whose threshold voltage increases at least to the target level. A program fail cell may refer to a memory cell whose threshold voltage is less than the target level.

Since a result value of a verify operation may vary depending on where the program fail cells are located, data storage speed and reliability of a semiconductor device may be reduced.

SUMMARY

A semiconductor device according to an embodiment of the invention may include a memory block including even memory cells configured to form an even page and odd memory cells configured to form an odd page. The semiconductor device may also include an operation circuit configured to perform a program operation on the even memory cells and the odd memory cells. A first verify operation may separately verify the even memory cells and the odd memory cells. A second verify operation may simultaneously verify the even memory cells and the odd memory cells. The operation circuit may be configured to selectively perform the first verify operation and the second verify operation depending on a number of adjacent program fail cells in response to a verify result value.

In an embodiment of the invention, a memory system comprises: a memory device and a controller electrically coupled to the memory device. The memory device includes an operation circuit configured to perform a first verify operation to verify even memory cells and odd memory cells. The operation circuit also performs a second verify operation to verify the even memory cells and the odd memory cells. The operation circuit performs the first verify operation and the second verify operation in response to a number of adjacent program fail cells.

DETAILED DESCRIPTION

Various embodiments relate to a semiconductor memory device capable of improving operating characteristics and reliability and a method of operating the same. Hereinafter, various embodiments will be described in detail with reference to the accompanying drawings. The figures are provided to allow those having ordinary skill in the art to understand the scope of the embodiments of the disclosure. The invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
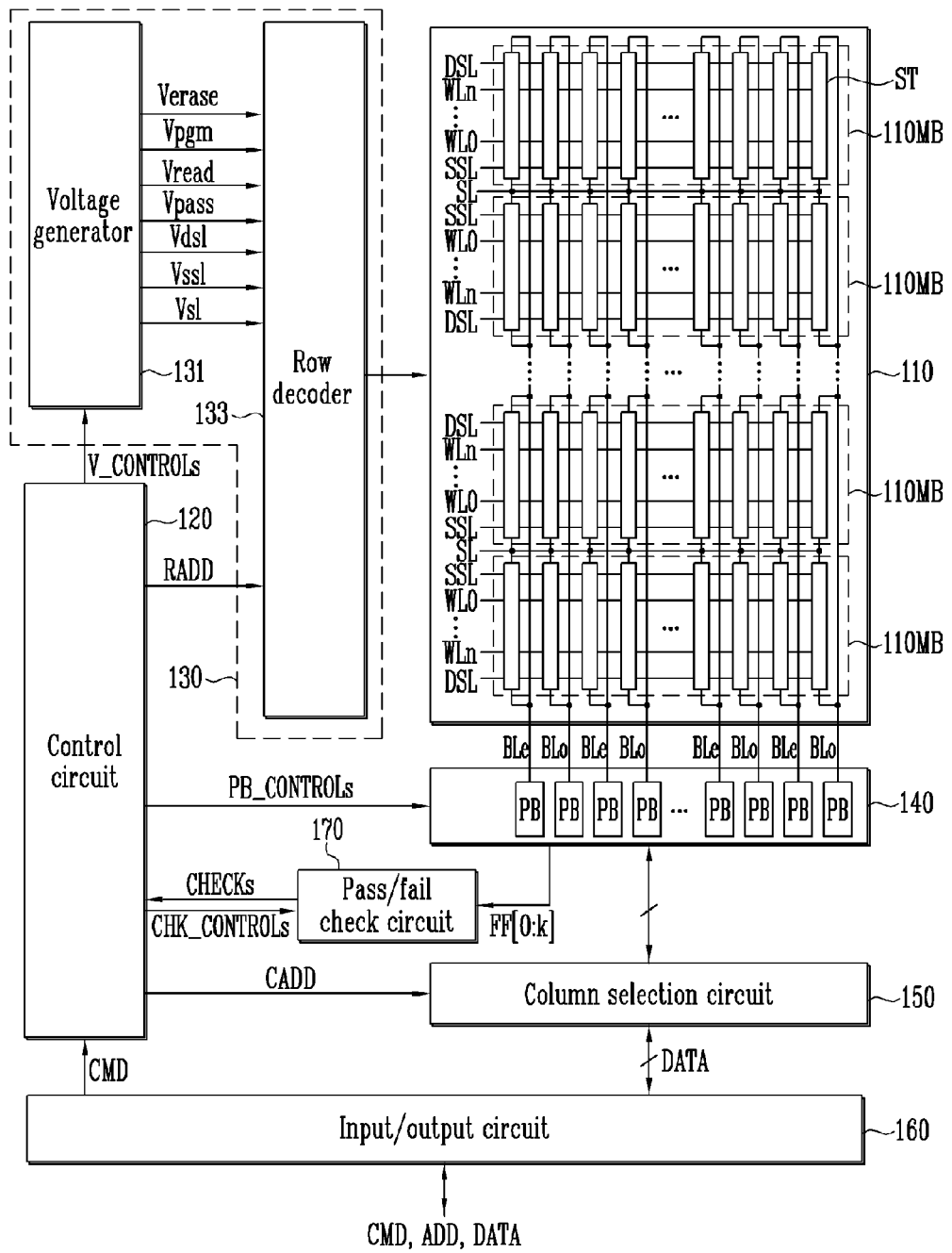
FIG. 1 is a block diagram illustrating a semiconductor device according to an embodiment of the invention.

Referring to FIG. 1, a circuit diagram of a semiconductor memory device is illustrated. The semiconductor memory device may include a memory array 110 and operation circuits 120 to 170.

The memory array 110 may include a plurality of memory blocks 110MB.

Figure 2:
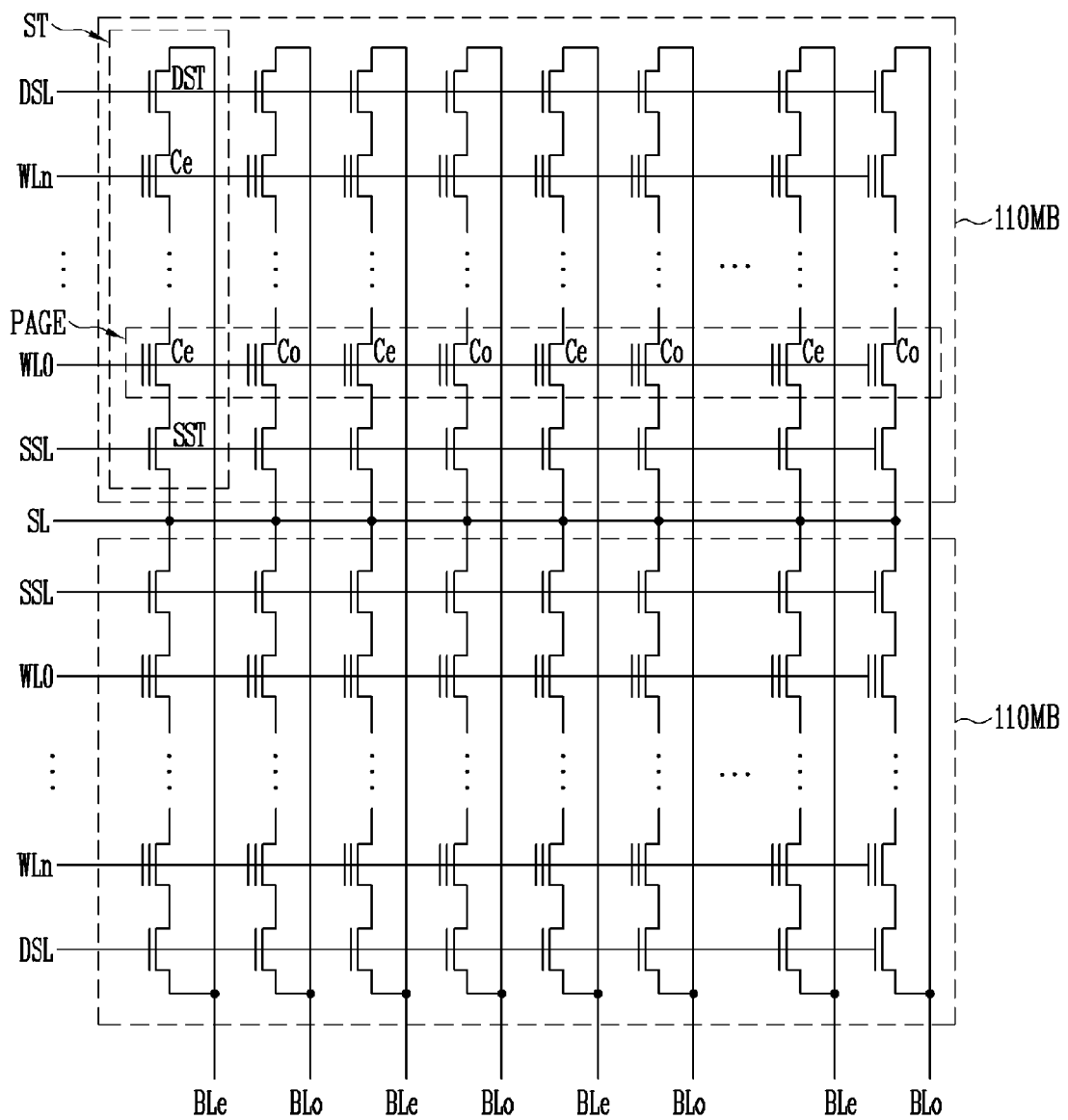
FIG. 2 is a circuit diagram illustrating a memory array shown in FIG. 1.

FIG. 2 is a view of the memory array shown in FIG. 1.

Referring to FIG. 2, the structure of the memory block 110MB is described. Each of the memory blocks 110MB may include a plurality of memory strings ST electrically coupled between bit lines Ble and Blo and a common source line SL. More specifically, each of the memory strings ST may be electrically coupled to a corresponding one of the bit lines BLe and BLo and electrically coupled in common to the common source line SL. Each of the memory strings ST may include a source selection transistor SST including a source electrically coupled to the common source line SL. The memory strings ST may also include a cell string electrically coupled in series to a plurality of memory cells Ce. In addition, the memory strings ST may include a drain selection transistor DST including a drain electrically coupled to the bit line BLe. The memory cells Ce, included in the cell string, may be electrically coupled in series between the selection transistors SST and DST. A gate of the source selection transistor SST may be electrically coupled to a source selection line SSL. Gates of the memory cells Ce may be electrically coupled to word lines WL0 to WLn, respectively. A gate of the drain selection transistor DST may be electrically coupled to a drain selection line DSL.

The drain selection transistor DST may control either a connection or a disconnection between the cell string and the bit line. The source selection transistor SST may control a connection or a disconnection between the cell string and the common source line SL.

In a NAND flash memory device, memory cells, which are included in a memory cell block, may be divided into a physical page unit or a logical page unit. For example, memory cells Ce and Co electrically coupled to a single word line, e.g., the word line WL0, may form a single physical page PAGE. In addition, even memory cells Ce electrically coupled to the word line e.g., WL0, may form a single even physical page. Further, odd memory cells Co may form a single odd physical page. This page (or even page and odd page) may be a basic unit for a program operation or a read operation.

Referring again to FIG. 1, the operation circuits 120 to 170 may perform a program loop, an erase loop and a read operation on the memory cells Ce and Co electrically coupled to a selected word line, e.g., the word line WL0. The program loop may include a program operation and a verify operation. The erase loop may include an erase operation and a verify operation. The verify operation performed after the program operation may be divided into a first verify operation and a second verify operation. The first verify operation may be in which even cells and odd cells are separately verified. The second verify operation may be in which even cells and odd cells are verified at the same time. To perform a program loop, an erase loop and a read operation, the operation circuits 120 to 170 may selectively output operating voltages. The operating voltages may be indicated by Verase, Vpgm, Vread, Vpass, Vdsl, Vssl and Vsl. Further, the operating voltages may be selectively output to the common source line SL and local lines SSL, WL0 to WLn, and DSL of a selected memory block. The operation circuits 120 to 170 may also control the precharging/discharging of the bit lines Ble and Blo or sense a current flow of the bit lines Ble and Blo.

In a NAND flash memory device, operation circuits may include a control circuit 120, a voltage supply circuit 130, a read/write circuit 140, a column selection circuit 150, an input/output circuit 160 and a pass/fail check circuit 170.

The control circuit 120 may output a voltage control signal V_CONTROLs for controlling the voltage supply circuit 130 to generate the operating voltages Verase, Vpgm, Vread, Vpass, Vdsl, Vssl and Vsl at desired levels. The control circuit 120 may control the voltage supply circuit 130 so that a program loop, an erase loop and a read operation may be performed in response to a command signal CMD. The command signal CMD may be input from exterior through the input/output circuit 160. In addition, the control circuit 120 may output control signals PB_CONTROLs for controlling circuits PB included in the read/write circuit 140 to perform the program loop, the erase loop and the read operation. In addition, when an address signal ADD is input to the control circuit 120, the control circuit 120 may output a column address signal CADD and a row address signal RADD.

The control circuit 120 may output a check control signal CHK_CONTROLs to the pass/fail check circuit 170 to select a pass/fail check method.

The voltage supply circuit 130 may generate the operating voltages Verase, Vpgm, Vread, Vpass, Vdsl, Vssl and Vsl necessary for the program loop, the erase loop and the read operation of the memory cells. The voltage supply circuit 130 may generate the operating voltages in response to the voltage control signal V_CONTROLs of the control circuit 120. The voltage supply circuit may also output the operating voltages to the common source line SL and the local lines SSL, WL0 to WLn, and DSL of the selected memory block, in response to the row address signal RADD of the control circuit 120.

The voltage supply circuit 130 may include a voltage generator 131 and a row decoder 133. The voltage generator 131 may generate the operating voltages Verase, Vpgm, Vread, Vpass, Vdsl, Vssl and Vsl in response to the voltage control signal V_CONTROLs of the control circuit 120. The row decoder 133 may transfer the operating voltages to the common source line SL and the local lines SSL, WL0 to WLn, and DSL of the selected memory block, among the memory blocks 110MB. Moreover, the row decoder may transfer the operating voltages in response to the row address signal RADD of the control circuit 120.

The voltage supply circuit 130 may output and change the operating voltages Verase, Vpgm, Vread, Vpass, Vdsl, Vssl and Vsl in response to the voltage control signal V_CONTROLs of the control circuit 120.

The read/write circuit 140 may include a plurality of page buffers PB electrically coupled to the memory array 110 through the bit lines Ble and Blo. More specifically, each of the page buffers PB may be electrically coupled to each of the bit lines Ble and Blo. Moreover, a single page buffer PB may be electrically coupled to a single bit line. During a program operation, the page buffers PB may selectively precharge the bit lines Ble and Blo in response to the control signals PB_CONTROLs of the control circuit 120 and data DATA to be stored in the memory cells. During a program verify operation or a read operation, the page buffers PB may precharge the bit lines Ble and Blo. The page buffers PB may then sense a voltage variation or a current of the bit lines Ble and Blo and latch data read from the memory cells in response to the PB control signals PB_CONTROLs. The PB control signals PB_CONTROLs may be of the control circuit 120. The page buffers PB may output a verify result value FF[0:k] to the pass/fail check circuit 170 in response to the latched data during the verify operation.

Figure 3:
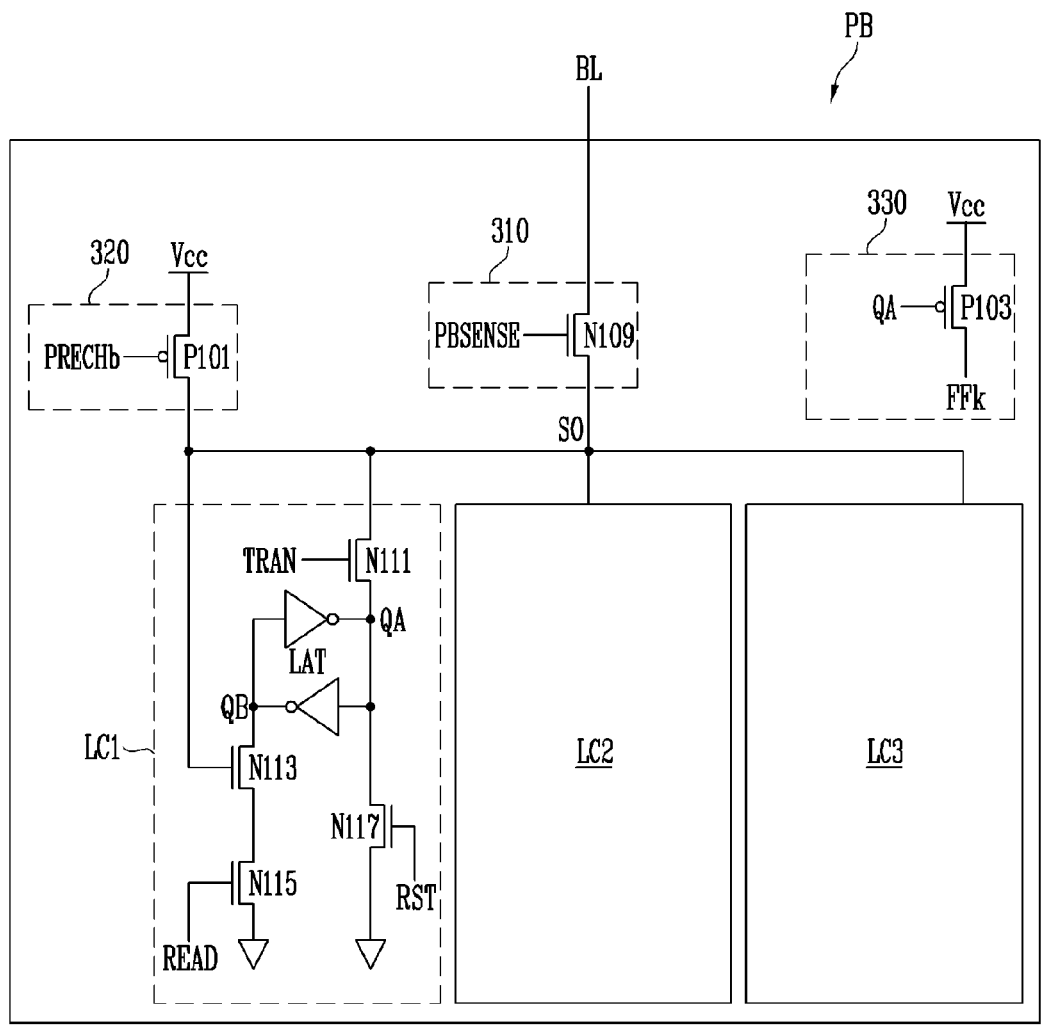
FIG. 3 is a circuit diagram illustrating a read/write circuit shown in FIG. 1.

Referring to FIG. 3, a circuit diagram of the read/write circuit of FIG. 1 is illustrated. More specifically, the page buffer of the read/write circuit may operate in response to the control signal PB_CONTROLs of the control circuit shown in FIG. 1. Signals PRECHb, PBSENSE, TRAN, READ and RST may be included in the control signal PB_CONTROLs of the control circuit.

The page buffer PB may include a bit line coupling circuit 310, a precharge circuit 320 and latch circuits LC1 to LC3. In addition, the page buffer PB may further include a verify result output circuit 330.

The bit line coupling circuit 310 may electrically couple one of the latch circuits LC1 to LC3 to the bit line BL in response to a connection signal PBSENSE. The connection signal PBSENSE may be applied at different levels when the bit line BL is precharged and when a voltage level of the bit line BL is sensed. The bit line coupling circuit 310 may include a switching device N109 that operates in response to the connection signal PBSENSE. The latch circuits LC1 to LC3 may be electrically coupled in parallel with the switching device N109. A connection node of a bit line coupling circuits 420 and the latch circuits LC1 to LC3 may be a sensing node SO.

The precharge circuit 320 may include a switching device P101. The switching device P101 may be electrically coupled between a power supply terminal and the sensing node SO. In addition, the switching device P101 may operate in response to a precharge signal PRECHb. The precharge circuit 320 may precharge the sensing node SO. A voltage Vcc precharged to the sensing node SO may be used as a precharge voltage for precharging the bit line BL. More specifically, the precharge circuit 320 may output the precharge voltage for precharging the sensing node SO or the bit line BL.

The number of latch circuits may vary for different design needs. In general, only one of the latch circuits LC1 to LC3 may be activated. Among them, the second latch circuit LC2 may be used as a cache latch circuit that temporarily stores externally input data. The second latch circuit LC2 may transfer the data to the latch circuit LC3 or temporarily store the data, read from the memory cell during a read operation to output the data. The third latch circuit LC3 may apply a program inhibition voltage or a program permission voltage to the bit line in response to the data transferred from the second latch circuit LC2 during a program operation. In addition, the third latch circuit LC3 may temporarily store the data stored in the memory cells in response to the voltage of the bit line during the read operation. The third latch circuit LC3 may transfer the data to the second latch circuit LC2. The first latch circuit LC1 may latch a comparison result between a threshold voltage of the memory cell and a target voltage. The first latch circuit LC1 may also output a comparison result signal corresponding to the comparison result to a first node QA during a verify operation subsequent to the program operation.

The latch circuits may include a plurality of switching devices and a latch.

The first latch circuit LC1 may include a latch LAT, a switching device N111, a switching device N113, a switching device N115 and a switching device N117. The latch LAT may latch data. The switching device N111 may electrically couple a non-inverting terminal QA of the latch LAT to the sensing node SO in response to a transfer signal TRAN. The switching device N113 may be electrically coupled to an inverting terminal QB of the latch LAT and operate in response to a voltage of the sensing node SO. The switching device N115 may be electrically coupled between the switching device N113 and a ground terminal. In addition, the switching device N115 may operate in response to a read signal READ. The switching device N117 may be electrically coupled between the non-inverting terminal QA of the latch LAT and a ground terminal. Further, the switching device N117 may operate in response to a reset signal RST. The latch LAT may be initialized in response to a reset signal RST, and the non-inverting terminal QA may be at a low level.

Since signals having different waveforms are input to the other latch circuits LC2 and LC3, only one latch circuit may be activated. In the alternative, the latch circuits LC1 to LC3 may perform different functions from the latch circuit LC1 even when the latch circuits LC1 to LC3 have the same configuration.

The verify result output circuit 330 may include a switching device P103 electrically coupled between the power supply terminal and an output node. The switching device P103 may operate in response to a signal output to the non-inverting terminal QA of the latch LAT.

During the verify operation, the bit line BL may be discharged when the threshold voltage of the memory cell is less than the target voltage. In addition, the bit line BL may remain precharged when the threshold voltage of the memory cell is greater than or equal to the target voltage. A potential of the sensing node SO may be determined depending on a potential of the bit line BL by the bit line coupling circuit 310. In response to the potential of the sensing node SO and the read signal READ, the non-inverting terminal QA of the latch LAT may be maintained at a low state (program fail status). The non-inverting terminal QA may remain in the low state when the threshold voltage of the memory cell is less than the target voltage. The switching devices N113 and N115 may be turned on and the non-inverting terminal QA may be changed to a high state (program pass status). The non-inverting terminal QA may be in the high state when the threshold voltage of the memory cell is greater than or equal to the target voltage.

When the memory cell has the program fail status, the verify result output circuit 330 may output a power voltage as a verify result value FFk in response to a potential of the non-inverting terminal QA of the latch LAT. When the memory cell has the program pass status, the verify result output circuit 330 may set the output node to a floating state in response to the potential of the non-inverting terminal QA of the latch LAT. The verify result value FFK is output throughout the output node. More specifically, the verify result output circuit 330 may not output any signal to the output node.

Referring again to FIG. 1, the column selection circuit 150 may select the page buffers PB, included in the read/write circuit 140, in response to the column address CADD output from the control circuit 120. In particular, the column selection circuit 150 may sequentially transfer the data to be stored in the memory cells to the page buffers PB in response to the column address CADD. In addition, the column selection circuit 150 may sequentially select the page buffers PB in response to the column address CADD. The column selection circuit 150 may sequentially select the page buffers PB so that the data of the memory cells latched to the page buffers PB during the read operation may be externally output.

The input/output circuit 160 may transfer the command signal CMD and the address signal ADD, which are input from exterior, to the control circuit 120. In addition, the input/output circuit 160 may transfer the externally input data DATA to the column selection circuit 150. The input/output circuit 160 may also transfer the data, read from the memory cells during the read operation, to exterior during the program operation.

The pass/fail check circuit 170 may sense the amount of current varying depending on the verify result value FF[0:k], output from the page buffers PB. The pass/fail check circuit 170 may sense the amount of current varying to determine program a pass/fail after the first verify operation or the second verify operation. In addition, the pass/fail check circuit 170 may determine the number of adjacent program fail cells in response to the verify result value FF[0:k], output from the page buffers PB. Moreover, the pass/fail check circuit 170 may determine the number of adjacent program fail cells to determine a program pass/fail after the first verify operation or the second verify operation.

Figure 4:
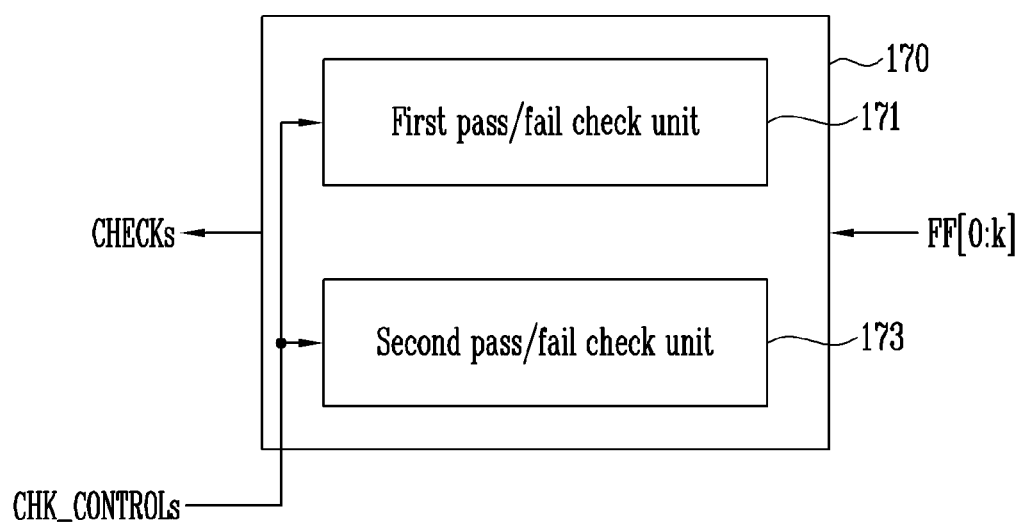
FIG. 4 is a block diagram illustrating a pass/fail check circuit shown in FIG. 1.

Referring to FIG. 4, a block diagram of the pass/fail check circuit in FIG. 1 is illustrated. The pass/fail check circuit 170 may include a first pass/fail check unit 171 and a second pass/fail check unit 173.

The first pass/fail check unit 171 may sense the amount of current varying depending on the verify result value FF[0:k] after the first verify operation or the second verify operation is performed. The first pass/fail check unit 171 may output a pass/fail result signal CHECKs for determining program pass/fail to the control circuit 120.

The second pass/fail check unit 173 may detect a column address of program fail cells by using the verify result value FF[0:k] after the first verify operation or the second verify operation is performed. Further, the second pass/fail check unit 173 may output the pass/fail result signal CHECKs for determining program pass/fail to the control circuit 120 in response to the column address. In addition, the second pass/fail check unit 173 may detect the number of adjacent program fail cells by using the column address.

The first pass/fail check unit 171 may sense the amount of current varying depending on the verify result value FF[0:k].

However, the second pass/fail check unit 173 may detect the column address of the program fail cells by using the verify result value FF[0:k] and detect the number of adjacent program fail cells by using the column address. As a result, a pass/fail determination speed of the first pass/fail check unit 171 may be faster than that of the second pass/fail check unit 173.

Either the first pass/fail check unit 171 or the second pass/fail check unit 173 may operate in response to the check control signal CHK_CONTROLs output from the control circuit 12. The first pass/fail check unit 171 or the second pass/fail check unit 173 may operate to select a pass/fail check method. For example, in a program operation using an Increment Step Pulse Program (ISPP), when the number of program operations is smaller than a reference number, the first pass/fail check unit 171 may operate. When the number of program operations is greater than or equal to the reference number, the second pass/fail check unit 173 may operate. Alternatively, the first pass/fail check unit 171 may operate after the second pass/fail check unit 173 operates several times.

In addition, when the number of program operations is greater than or equal to the reference number and the number of adjacent program fail cells is greater than or equal to the reference number, the second pass/fail check unit 173 may operate. The second pass/fail check unit 173 may then operate after the program operation and the first verify operation are performed. In addition, when the number of program operations is greater than or equal to the reference number and the number of adjacent program fail cells is smaller than the reference number, the first pass/fail check unit 171 may operate. The first pass/fail check unit 171 may then operate after the program operation and the second verify operation are performed.

Figure 5:
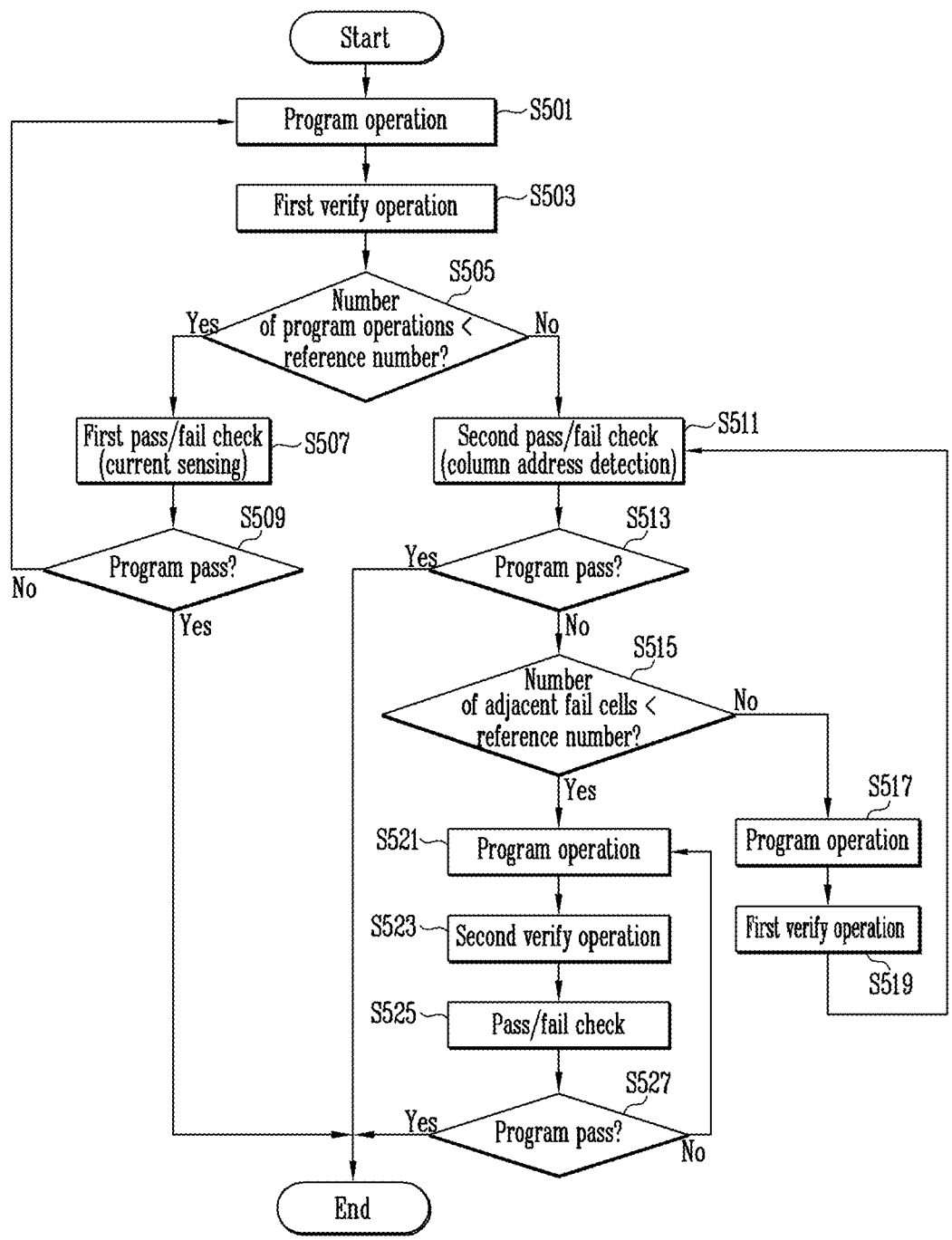
FIG. 5 is a flowchart illustrating operations of a semiconductor device according to an embodiment of the invention.
Figure 6:
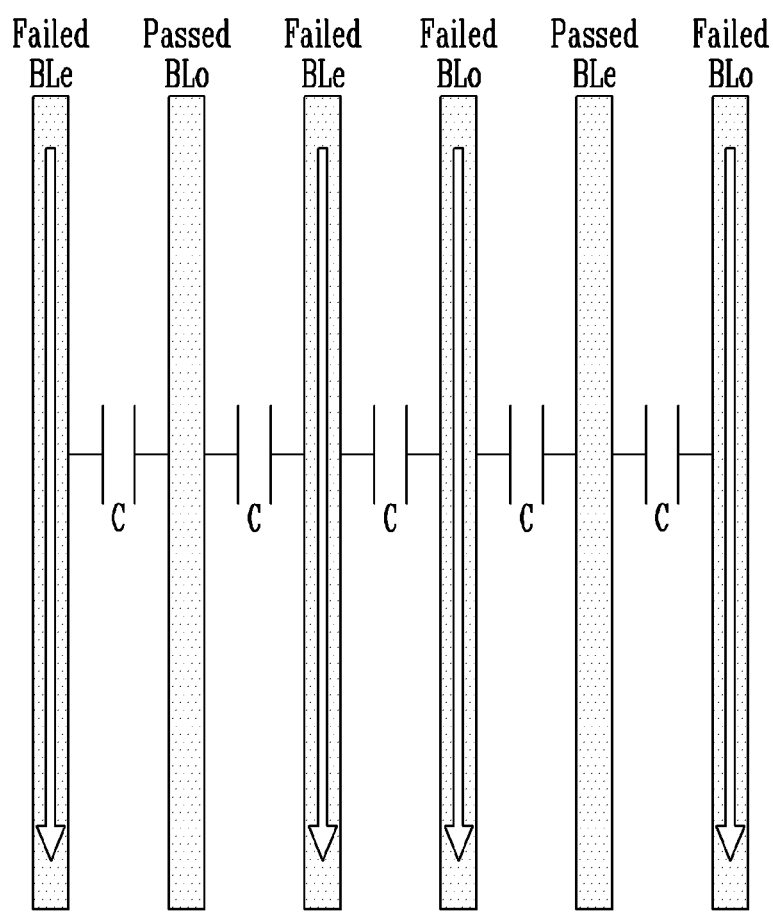
FIG. 6 is a diagram illustrating operations of a semiconductor device according to an embodiment of the invention.

Referring to FIG. 5, a flowchart illustrating operations of a semiconductor device according to embodiments of the invention is shown. Referring to FIG. 6, a view illustrating operations of a semiconductor device is shown.

Referring to FIGS. 1 and 5, a first program loop may be performed at steps S501 to S509. More specifically, a program operation may be performed to store data in memory cells at step S501. A verify operation may be performed on the memory cells at step S503. At an initial stage, after the program operation is performed, a first verify operation may be performed so that even cells and odd cells may be verified separately.

Referring to FIG. 6, a plurality of bit lines are defined by pass bit lines Passed BLo and Passed BLe coupled to program passs cells and fail bit lines Failed BLe and Failed BLo coupled to program fail cells. When the program fail cells are adjacent to each other, a precharged voltage to the program fail bit lines Failed BLe and Failed BLo adjacent to each other may be discharged at the same time. Consequently, errors may occur. Therefore, when a verify operation of the even cells and odd cells are performed separately, the precharged voltage to the program fail bit lines Failed BLe and Failed BLo adjacent to each other may be prevented from being discharged at the same time. However, the time taken to perform the verify operation may be increased since the verify operation of the even cells and the verify operation of the odd cells are performed separately.

Referring again to FIGS. 1 and 5, the control circuit 120 may count the number of times the program operation is performed by using an internal counter. The control circuit 120 may determine whether the number of program operations is smaller than a reference number at step S505. When the number of program operations is smaller than the reference number, the first pass/fail check unit 171 of the pass/fail check circuit 170 may operate at step S507. In other words, at step S507, the operation circuits 120 to 170 may sense the amount of current varying depending on a verify result of the first verify operation. The operation circuits 120 to 170 may sense the amount of current varying to determine a program pass/fail.

Initially, since the number of program fail cells is greater than the number of program pass cells, the number of adjacent program fail cells may be greater than a reference number. Therefore, pass/fail may be determined quickly at the initial stage simply by checking the amount of current by using the first pass/fail check unit. The amount of current may be checked instead of detecting the number of adjacent program fail cells by using the first pass/fail check unit.

The program loop may be terminated when a program pass is determined by the first pass/fail check unit at step S509. However, steps S501 to S509 may be repeated when a program fail is determined by the first pass/fail check unit at step S509.

Steps S511 to S519 may be performed for a second program loop when it is determined by the control circuit 120 that the number of program operations is greater than or equal to the reference number at step S505.

At step S511, the operation circuits 120 to 170 may detect the number of adjacent program fail cells to determine a program pass/fail after the first verify operation (S503). As a result, the second pass/fail check unit of the pass/fail check circuit 170 may operate. The second pass/fail check unit may detect a column address of the program fail cells by using an even verify result. The second pass/fail check unit may also use output from the read/write circuit 140 during the verify operation of the even cells. Further, the second pass/fail check unit may use an odd verify result, output from the read/write circuit 140 during the verify operation of the odd cells. In addition, the second pass/fail check unit may detect the number of adjacent program fail cells by using the detected column address. A pair of adjacent program fail cells may count as one or two.

The program loop may be terminated when a program pass is determined by the second pass/fail check unit at step S513. However, when the program fail is determined by the second pass/fail check unit at step S513, the control circuit 120 may compare the number of adjacent program fail cells with the reference number. The operation circuits 120 to 170 may perform a program operation (S517) and a first verify operation (S519) when the number of adjacent program fail cells is greater than or equal to the reference number at step S515. Since the errors described above in FIG. 6 may arise when there are many program fail cells, it may be desirable to perform the first verify operation instead of the second verify operation.

After the first verify operation (S519) is performed, the operation circuits 120 to 170 may detect the number of adjacent program fail cells to determine program pass/fail at step S511. When the program fail is determined by the second pass/fail check unit at step S513 and the number of adjacent program fail cells is smaller than the reference number at step S515, steps S521 to S527 may be performed for a third program loop.

The operation circuits 120 to 170 may sequentially perform a program operation (S521) and a second verify operation (S523). Even when the errors described in FIG. 6 arise since the number of adjacent program fail cells is smaller than the reference number, correction may be carried out by an Error Correction Code (ECC) circuit. Therefore, it may not be necessary to separately perform the verify operation of the even cells and the verify operation of the odd cells. Accordingly, the time taken to perform a verify operation may be reduced by performing the second verify operation in which the even cells and the odd cells are verified at the same time.

After the second verify operation is performed at S523, a pass/fail check operation may be performed at step S525. The first pass/fail check unit or the second pass/fail check unit may operate in order to perform the pass/fail check operation. When a checking method of the first pass/fail check unit is faster than that of the second pass/fail check unit, a pass/fail check of the program operation may be confirmed by the first pass/fail check unit.

The program loop may be terminated when the program pass is determined by the first or second pass/fail check unit at step S527. However, when the program fail is determined at step S527, the third program loop may be repeated through steps S521 to S527.

When the number of program operations is smaller than the reference number, the operation circuits 120 to 170 may perform the first verify operation. As a result, the operation circuits 120 to 170 may determine program pass/fail by the first pass/fail check unit. When the number of program operations is greater than or equal to the reference number and the number of adjacent program fail cells is smaller than the reference number, the operation circuits 120 to 170 may perform the second verify operation. Consequently, the operation circuits 120 to 170 may determine program pass/fail by the first pass/fail check unit.

Accordingly, data storage speed may be increased, and data storage reliability may be improved.

Figure 7:
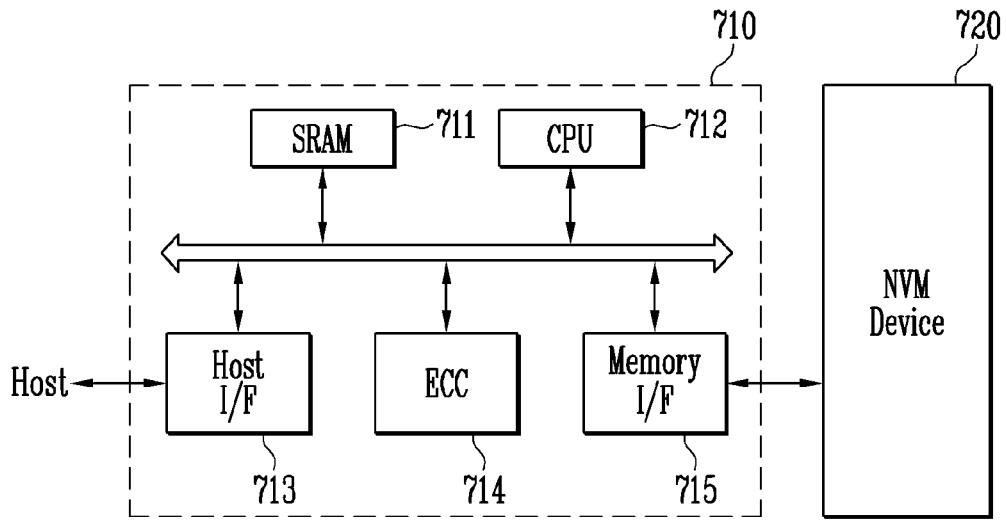
FIG. 7 is a schematic block diagram illustrating a memory system according to an embodiment of the invention.

Referring to FIG. 7, a schematic diagram of a memory system is illustrated. A memory system 700 according to an embodiment of the invention may include a non-volatile memory device 720 and a memory controller 710.

The non-volatile memory device 720 may include the earlier-described semiconductor device. The memory controller 710 may control the non-volatile memory device 720. The memory system 700 having the above-described configuration may be a solid state disk (SSD) or a memory card. The memory device 720 and the memory controller 710 are combined in the SSD or the memory card. SRAM 711 may function as an operation memory of the CPU 712. A host interface 713 may include a data exchange protocol of a host being electrically coupled to the memory system 700. An ECC block 714 may detect and correct errors included in a data read from the non-volatile memory device 720. A memory interface 715 may interface with the non-volatile memory device 720. A CPU 712 may perform the general control operation for data exchange of the memory controller 710.

The memory system 700 may further include ROM (not illustrated) that stores code data to interface with the host. The non-volatile memory device 720 may be a multi-chip package composed of a plurality of flash memory chips. The memory system 700 may be provided as a storage medium having high reliability and low error rate. A flash memory device according to an embodiment may be provided in a memory system such as a semiconductor disk device (a solid state disk (SSD)) on which research has been actively conducted. For example, when the memory system 700 is an SSD, the memory controller 710 may communicate with the outside (e.g., a host) through one of the interface protocols including USB, MMC, PCI-E, SATA, PATA, SCSI, ESDI and IDE.

Figure 8:
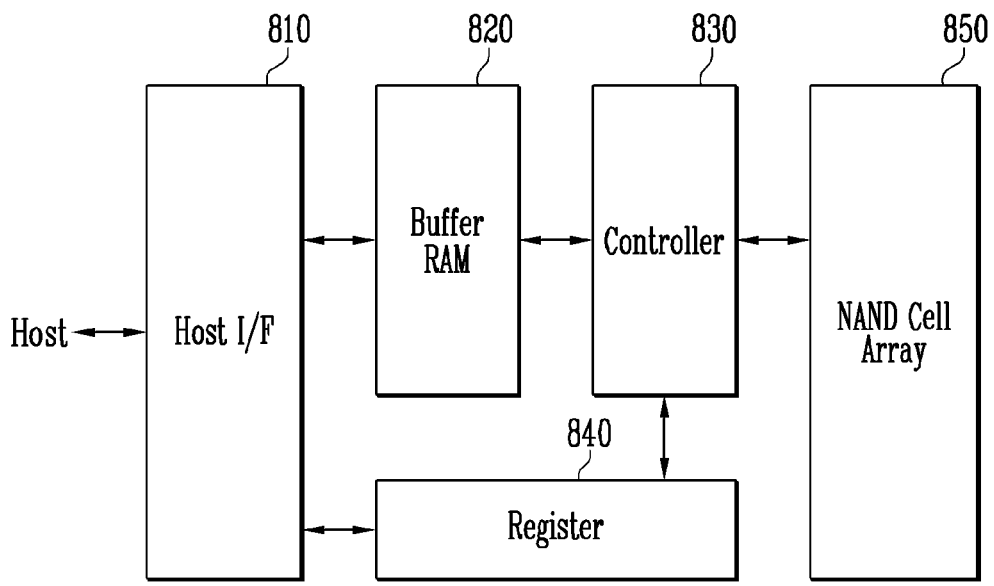
FIG. 8 is a schematic block diagram illustrating a fusion memory device or a fusion memory system performing a program operation according to an embodiment of the invention.

Referring to FIG. 8, a schematic block diagram of a fusion memory device or a fusion memory system that performs a program operation according to the aforementioned various embodiments is illustrated. For example, technical features of the invention may be applied to a OneNand flash memory device 800 as the fusion memory device.

The OneNand flash memory device 800 may include a host interface (I/F) 810, a buffer RAM 820, a controller 830, a register 840 and a NAND flash cell array 850. The host interface 810 may be configured to exchange various types of information with a device through a different protocol. The buffer RAM 820 may have built-in codes for driving the memory device or temporarily store data. The controller 830 may be configured to control read and program operations and every state in response to a control signal and a command that are externally given. The register 840 may be configured to store data including instructions, addresses and configurations defining a system operating environment in the memory device. The NAND flash cell array 850 may include operating circuits including non-volatile memory cells and page buffers. The memory array illustrated in FIG. 2 may be used as a memory array of the NAND flash cell array 850.

Figure 9:
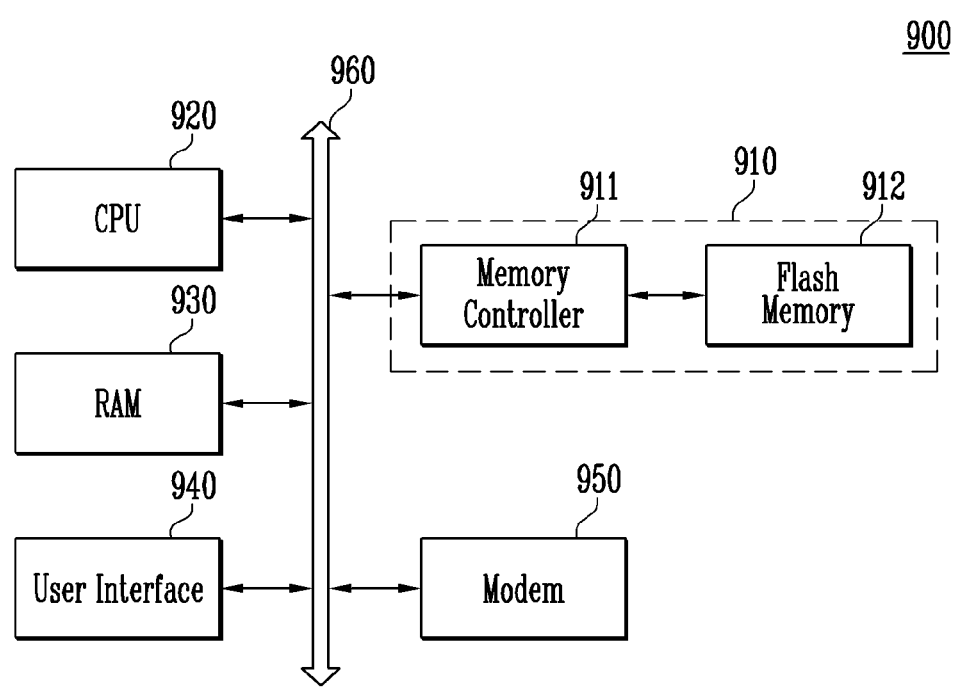
FIG. 9 is a schematic block diagram of a computing system including a flash memory device according to an embodiment of the invention.

Referring to FIG. 9, a schematic block diagram of a computing system including a flash memory device 912 according to an embodiment is illustrated.

A computing system 900 according to an embodiment may include a microprocessor (CPU) 920, RAM 930, a user interface 940, a modem 950, such as a baseband chipset. The computing system may also include a memory system 910 including a memory controller 911 and flash memory 912 electrically coupled to a system bus 960 along with the CPU 920, RAM 930, user interface 940 and the modem 950. In addition, if the computing system 900 is a mobile device, then a battery may be provided to apply operating voltages to the computing system 900. The computing system 900 may further include application chipsets, a Camera Image Processor (CIS), or mobile DRAM. The memory system 910 may form a Solid State Drive/Disk (SSD) that uses a non-volatile memory to store data. The memory system 910 may be provided as a fusion flash memory (e.g., OneNAND flash memory).

What is claimed is:

1. A semiconductor device, comprising:
    a memory block including even memory cells configured to form an even physical page and odd memory cells configured to form an odd physical page; and
    an operation circuit configured to perform a program operation on the even memory cells and the odd memory cells, a first verify operation for separately verifying the even memory cells and the odd memory cells, and a second verify operation for simultaneously verifying the even memory cells and the odd memory cells,
    wherein the operation circuit is configured to selectively perform the first verify operation and the second verify operation depending on a number of adjacent program fail cells, among a plurality of program fail cells, in response to a verify result value.

2. The semiconductor device of claim 1, wherein the first verify operation includes an even verify operation for verifying the even memory cells and an odd verify operation for verifying the odd memory cells.

3. The semiconductor device of claim 1, wherein the operation circuit is configured to perform the first verify operation after the program operation when a number of program operations is smaller than a reference number.

4. The semiconductor device of claim 3, wherein the operation circuit is configured to sense an amount of current varying depending on a verify result of the first verify operation to determine a program pass/fail after the first verify operation when the number of program operations is smaller than the reference number.

5. The semiconductor device of claim 1, wherein the operation circuit is configured to operate and detect the number of adjacent program fail cells to determine a program pass/fail when a number of program operations is greater than or equal to a reference number.

6. The semiconductor device of claim 5, wherein the operation circuit is configured to detect a column address of the program fail cells to detect the number of adjacent program fail cells in response to a verify result value.

7. The semiconductor device of claim 1, wherein the operation circuit is configured to perform the program operation and the first verify operation when the number of adjacent program fail cells is greater than or equal to a reference number.

8. The semiconductor device of claim 7, wherein the operation circuit is configured to detect the number of adjacent program fail cells to determine program pass/fail after the first verify operation is performed in response to a verify result value.

9. The semiconductor device of claim 1, wherein the operation circuit is configured to perform the program operation and the second verify operation when the number of adjacent program fail cells is smaller than a reference number.

10. The semiconductor device of claim 9, wherein the operation circuit is configured to sense an amount of current varying depending on a verify result of the second verify operation to determine a program pass/fail.

11. The semiconductor device of claim 1, wherein the operation circuit is configured to perform the first verify operation when a number of program operations is smaller than a reference number, and perform the first verify operation or the second verify operation to determine a program pass/fail depending on the number of adjacent program fail cells when the number of program operations is greater than or equal to the reference number.

12. The semiconductor device of claim 1, wherein the operation circuit is configured to perform the program operation and the first verify operation to determine a program pass/fail when a number of program operations and the number of adjacent program fail cells are greater than or equal to a reference number.

13. The semiconductor device of claim 12, wherein the operation circuit is configured to detect the number of adjacent program fail cells to determine the program pass/fail after the first verify operation is performed.

14. The semiconductor device of claim 1, wherein the operation circuit is configured to perform the program operation and the second verify operation when a number of program operations is greater than or equal to a reference number and the number of adjacent program fail cells are smaller than a reference number.

15. The semiconductor device of claim 14, wherein the operation circuit is configured to sense an amount of current varying depending on a verify result of the second verify operation in order to determine a program pass/fail.

16. The semiconductor device of claim 1, wherein the operation circuit comprises:
 a first pass/fail check unit configured to sense an amount of current varying depending on a verify result after the first or second verify operation is performed and determining a program pass/fail; and
 a second pass/fail check unit configured to detect a column address of the program fail cells after the first verify operation or the second verify operation is performed and determine the program pass/fail in response to the column address.

17. The semiconductor device of claim 16, wherein the second pass/fail check unit is configured to detect the number of adjacent program fail cells in response to the column address.

18. The semiconductor device of claim 16, wherein the first pass/fail check unit operates when a number of program operations is smaller than a reference number, and
 the first pass/fail check unit or the second pass/fail check unit operates when the number of program operations is greater than or equal to the reference number.

19. The semiconductor device of claim 16, wherein the second pass/fail check unit operates after the program operation and the first verify operation are performed when a number of program operations and the number of adjacent program fail cells is greater than or equal to a reference number.

20. The semiconductor device of claim 16, wherein the first pass/fail check unit operates after the program operation and the second verify operation are performed when a number of program operations is greater than or equal to a reference number and the number of adjacent program fail cells is smaller than a reference number.

* * * * *